(12) United States Patent
Schultz

(10) Patent No.: US 7,304,849 B2
(45) Date of Patent: Dec. 4, 2007

(54) COMPLIANT THERMAL CAP FOR AN ELECTRONIC DEVICE

(75) Inventor: Mark D. Schultz, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 161 days.

(21) Appl. No.: 10/919,180

(22) Filed: Aug. 16, 2004

(65) Prior Publication Data
US 2006/0034060 A1    Feb. 16, 2006

(51) Int. Cl.
*H05K 7/20* (2006.01)

(52) U.S. Cl. ............ 361/704; 361/707; 257/706; 257/707; 257/718

(58) Field of Classification Search .......... 361/704, 361/719; 257/712, 713; 165/80.3, 185
See application file for complete search history.

(56) References Cited

U.S. PATENT DOCUMENTS

| | | | |
|---|---|---|---|
| 4,561,011 A * | 12/1985 | Kohara et al. ............. 257/713 |
| 5,699,229 A * | 12/1997 | Brownell .................... 361/719 |
| 5,862,038 A | 1/1999 | Suzuki et al. .............. 361/704 |
| 5,875,096 A * | 2/1999 | Gates ......................... 361/704 |
| 5,881,800 A * | 3/1999 | Chung ....................... 165/80.3 |
| 5,889,323 A * | 3/1999 | Tachibana .................. 257/704 |
| 5,926,371 A * | 7/1999 | Dolbear ..................... 361/704 |
| 6,282,096 B1 * | 8/2001 | Lo et al. .................... 361/704 |
| 6,285,078 B1 | 9/2001 | Nelson ...................... 257/712 |
| 6,310,773 B1 * | 10/2001 | Yusuf et al. ............... 361/704 |
| 6,349,032 B1 * | 2/2002 | Chan et al. ................ 361/704 |
| 6,407,924 B1 * | 6/2002 | Brodsky .................... 361/704 |
| 6,411,513 B1 * | 6/2002 | Bedard ...................... 361/704 |
| 6,472,742 B1 * | 10/2002 | Bhatia et al. .............. 257/713 |
| 6,746,270 B2 | 6/2004 | Peterson .................... 439/487 |
| 6,870,246 B1 * | 3/2005 | Mullen et al. ............. 257/678 |
| 6,936,919 B2 * | 8/2005 | Chuang et al. ............ 257/717 |
| 6,939,742 B2 * | 9/2005 | Bhatia et al. .............. 438/117 |
| 2004/0144996 A1 * | 7/2004 | Inoue ........................ 257/200 |

* cited by examiner

*Primary Examiner*—Boris Chervinsky
(74) *Attorney, Agent, or Firm*—Michael J. Buchenhorner; Casey P. August

(57) ABSTRACT

A cooling structure for an electronic device comprises a compliant cap preloaded over the electronic device. The compliant cap comprises a horizontal top surface and at least one vertical support for the surface, the vertical support comprising a compliant portion and wherein the compliant cap comprises a thermally conducting material.

14 Claims, 5 Drawing Sheets

COMPLIANT THERMAL CAP FOR AN ELECTRONIC DEVICE

CROSS-REFERENCE TO RELATED APPLICATIONS

Not Applicable.

STATEMENT REGARDING FEDERALLY SPONSORED-RESEARCH OR DEVELOPMENT

Not Applicable.

INCORPORATION BY REFERENCE OF MATERIAL SUBMITTED ON A COMPACT DISC

Not Applicable.

FIELD OF THE INVENTION

The invention disclosed broadly relates to the field of electronic devices and more particularly relates to the field of thermal caps for electronic devices.

BACKGROUND OF THE INVENTION

During the normal operation of a computer, integrated circuit devices generate significant amounts of heat. This heat must be continuously removed, or the integrated circuit device may overheat, resulting in damage to the device and/or a reduction in operating performance. Cooling devices, such as heat sinks, have been used in conjunction with integrated circuit devices in order to avoid such overheating. Generally, a passive heat sink in combination with a system fan has provided a relatively cost-effective cooling solution. In recent years, however, the power of integrated circuit devices has increased exponentially, resulting in a significant increase in the amount of heat generated by these devices, thereby making it extremely difficult to extract heat form these devices.

Heat is typically extracted by coupling a heat spreader and a thermal cap to the electronic device as a heat sink. Heat sinks operate by conducting heat from a processor to the heat sink and then radiating it into the air. The better the transfer of heat between the two surfaces (the processor and the heat sink metal) the better the cooling. Some processors come with heat sinks attached to them directly, or are interfaced through a thin and soft layer of thermal paste, ensuring a good transfer of heat between the processor and the heat sink. The thermal paste serves not only to transfer heat but to provide some degree of mechanical compliance to compensate for dimensional changes driven by the high operating temperatures of the devices. However, the paste is a weak link in the thermal path. Attempts to thin this layer have resulted in failure of the layer when it is exposed to dimensional changes. There are some known mechanically complaint solutions but these solutions still rely on paste film somewhere in the path. Thus there is a need for a solution that overcomes these shortcomings.

SUMMARY OF THE INVENTION

Briefly according to an embodiment of the invention a cooling structure for an electronic device comprises a compliant cap preloaded over the electronic device. The compliant cap comprises a horizontal top surface and at least one vertical support for the surface, the vertical support comprising a compliant portion and wherein the compliant cap comprises a thermally conducting material. In another embodiment of the present invention, the horizontal top surface comprises a top plate comprising thinned edges and the compliant cap comprises a first material having high thermal conductivity and a second material comprising compliant properties.

In yet another embodiment of the present invention, a method for cooling an electronic device comprises placing an electronic circuit on a substrate and preloading a compliant cap over the electronic device. The compliant cap comprises compliant properties and heat conducting properties. In yet another embodiment of the present invention, the method further comprises applying a thermal interface material such as a paste between the electronic device and the thermal cap and applying a spreader over the electronic device for coupling with the thermal cap.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the left-most digit of a reference number identifies the drawing in which the reference number first appears.

DETAILED DESCRIPTION

Figure 1:
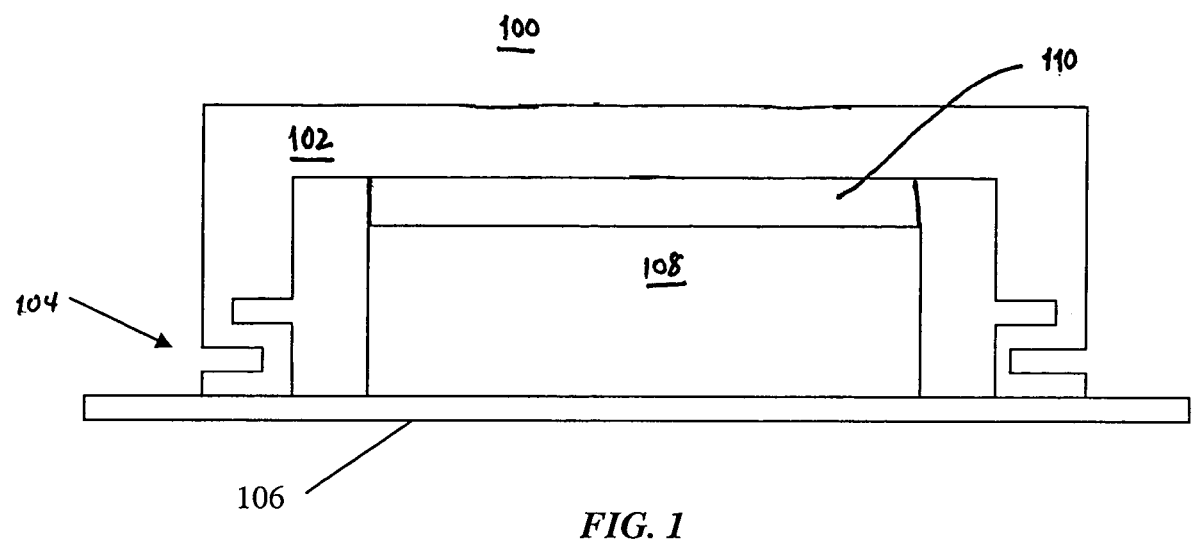
FIG. 1 shows a compliant thermal cap according to an embodiment of the invention.
Figure 1A:
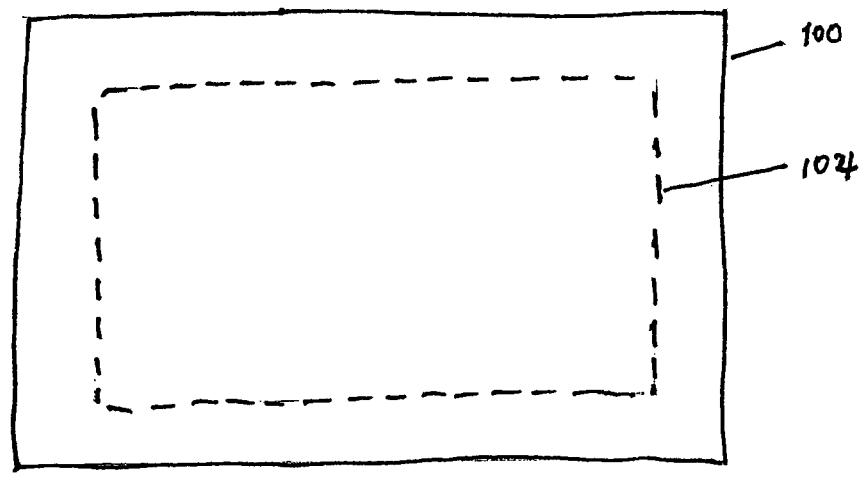
FIG. 1A shows a top view of the cooling structure of FIG. 1.

FIG. 1 shows a cross sectional side view of a cooling structure 100 for an electronic device 108. A compliant thermal cap 102 comprises a serpentine portion 104 for providing the resilience required to overcome the problems of the prior art. The electronic device (e.g., a semiconductor chip) 108, situated on a circuit board 106, is connected by a coupling layer 110 comprising a thermal paste, adhesive, or other thermal interface material. The layer 110 can also act as a heat spreader for extracting heat from the chip 108. The cap 102 serves the function of dissipating heat generated by the electronic device 108 and has compliance in the "z" direction to conform to thermal expansion by the device 108 and its substrate materials caused by the difference in the coefficients of thermal expansions of the materials of the device 108 and its substrate materials and the cap 102. FIG. 1A shows a top view of the cooling structure 100. The device 108 is shown in broken lines.

Figure 2:
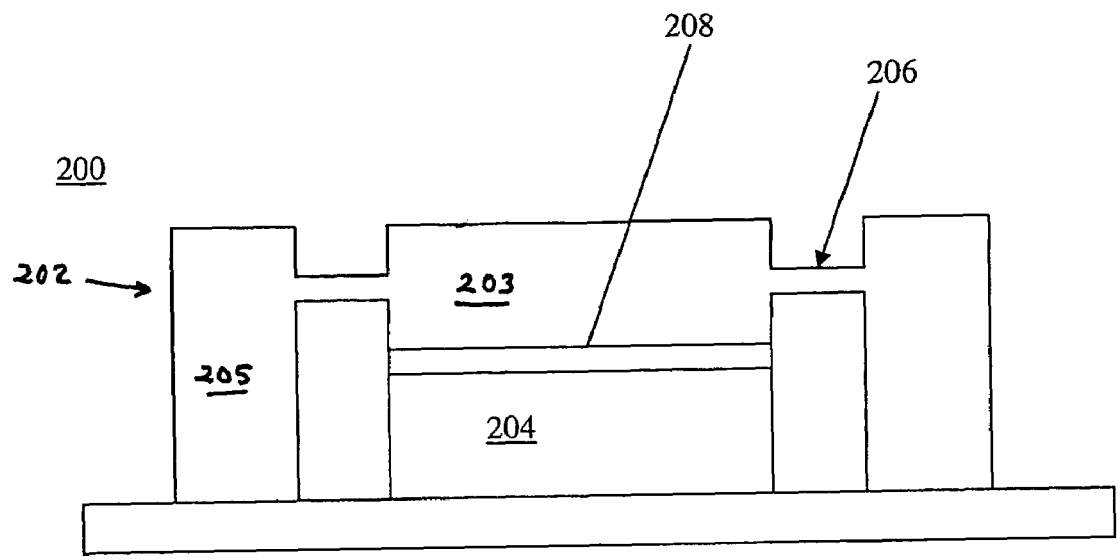
FIG. 2 shows a compliant thermal cap according to an alternate embodiment of the invention.

FIG. 2 shows a cooling structure 200 comprising a compliant thermal cap 202 according to an alternate embodiment of the invention. The compliant thermal cap 202 comprises a top plate (a horizontal top surface) 203 having thinned edges 206 that provide the required compliance to accommodate the vertical (z direction) movement cause by thermal (temperature) variations in the operation of the device 204. The compliant cap 202 also comprises a vertical support member 205. A thermally-conductive layer 208 attaches the device 204 to the top plate 203.

Figure 2A:
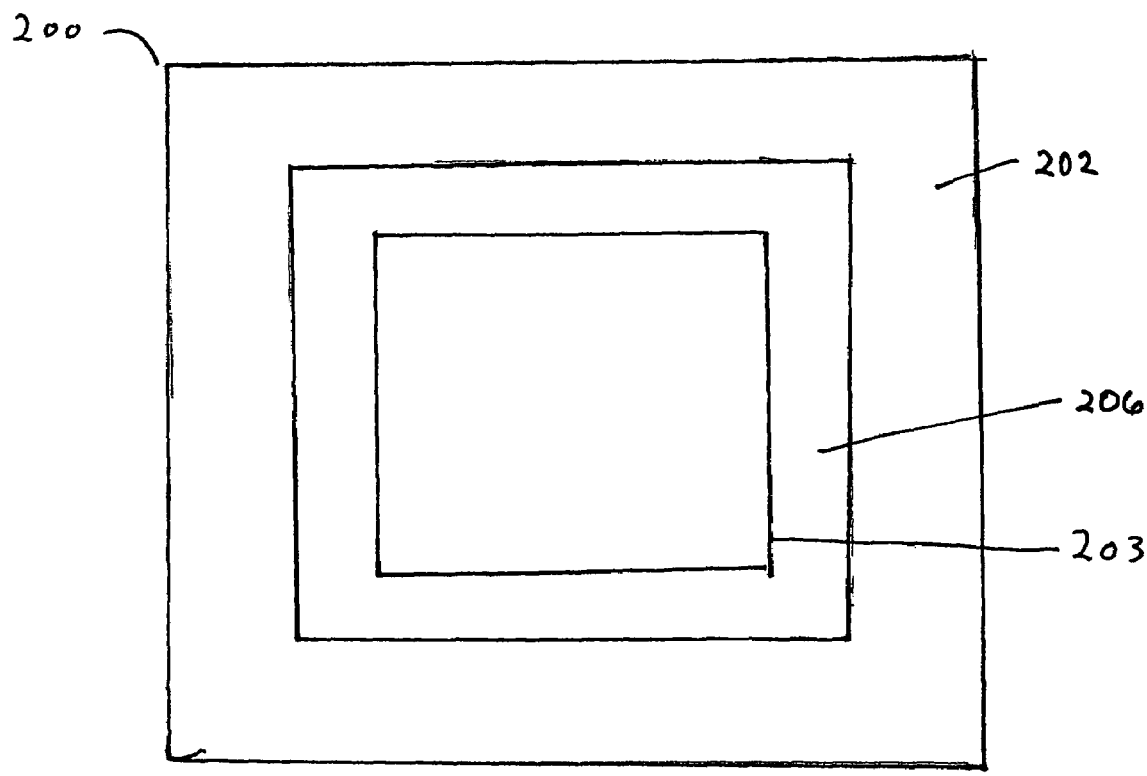
FIG. 2A shows a top view of the cooling structure of FIG. 2.

FIG. 2A is a top view of the cooling structure 200 shown in FIG. 2. The thermal cap 202 is shown, as well as an outline of the thinned edges 206 and the inner section of the top plate 203.

Figure 3:
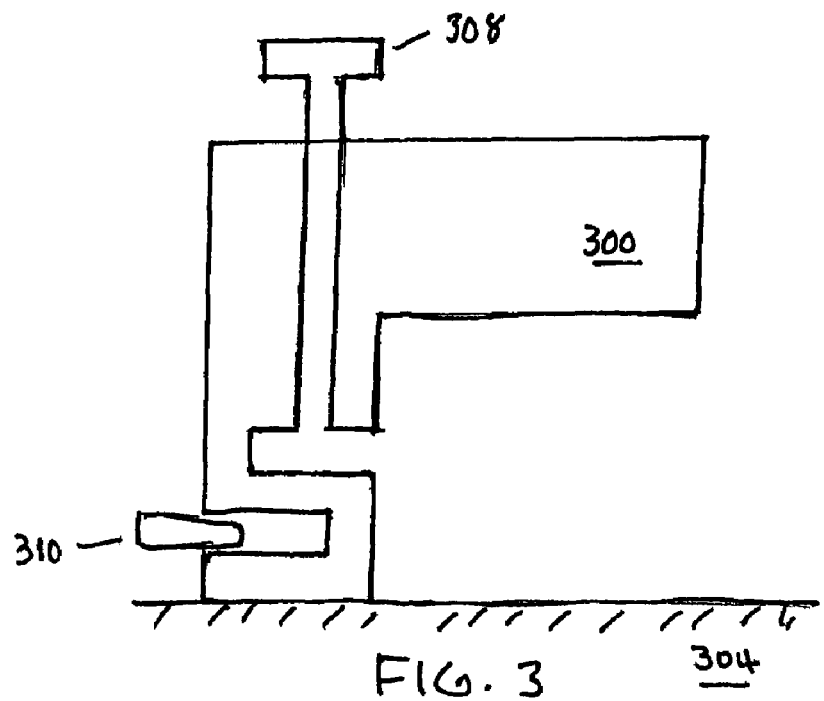
FIG. 3 shows a preload scheme for a thermal cap according to another embodiment of the invention.

FIG. 3 shows a preload scheme for a thermal cap according to a to another embodiment of the invention. The compliant cap 300 is preloaded so that the compliance of the cap maintains contact between the device and the cap 300, which is situated on a circuit board 304. The preload is accomplished by inserting pins 308 and 310 into holes in the cap 300.

Figure 4:
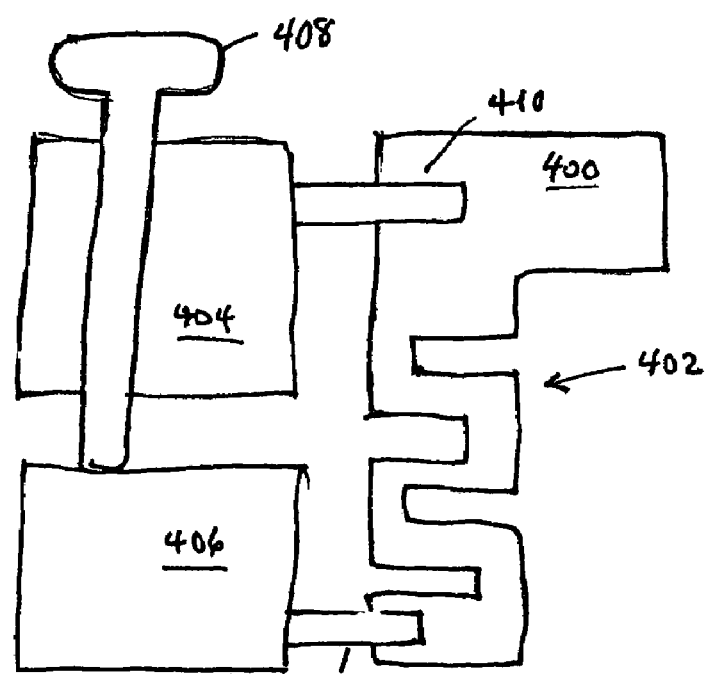
FIG. 4 shows another preload scheme for a thermal cap according to another embodiment of the invention.

FIG. 4 shows another preload scheme for a compliant thermal cap 400 comprising a serpentine compliant part 402 according to another embodiment of the invention. Members 404, 406, and 408 are temporarily attached to the cap, via connecting members 410 and 412, in order to provide preload while the cap is attached to the system. These members would be removed after the attachment was complete.

Figure 5:
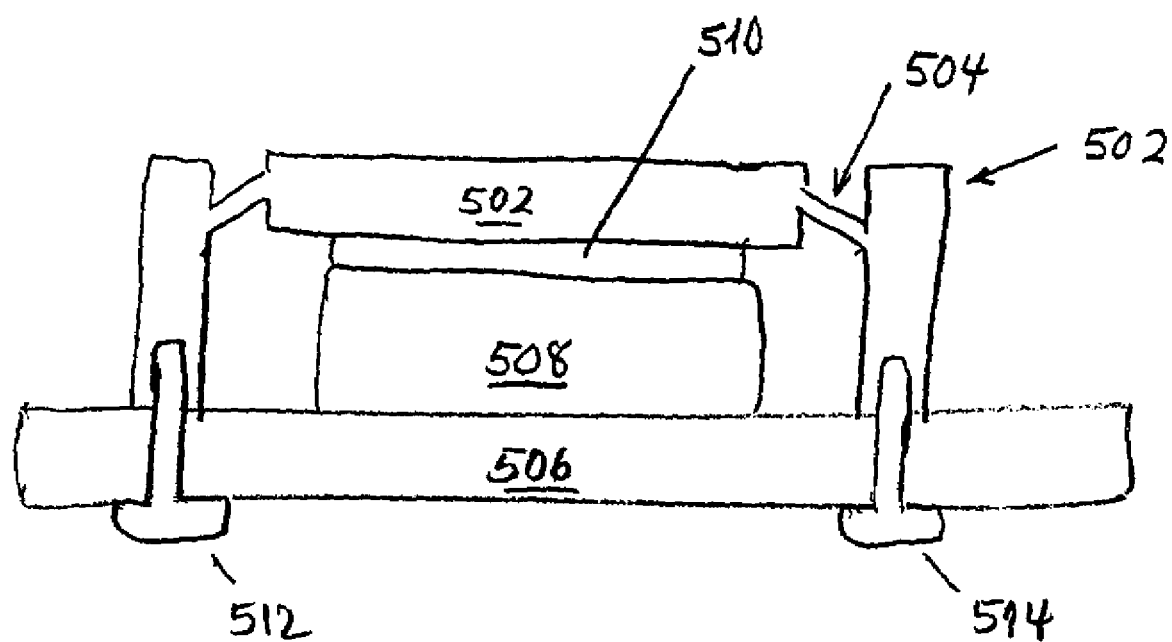
FIG. 5 shows another preload scheme for a thermal cap according to another embodiment of the invention.

FIG. 5 shows another preload scheme for a thermal cap 502 according to a to another embodiment of the invention. The device 508 is shown within the cap with the resilience preloaded (note the position of the thinned portions 504). The fasteners or screws 512 and 514 are inserted through the substrate or circuit board 506 to attach it to the cap 502. Additional compliance can be introduced by using a compliant material for the attachment layer 510.

Figure 6:
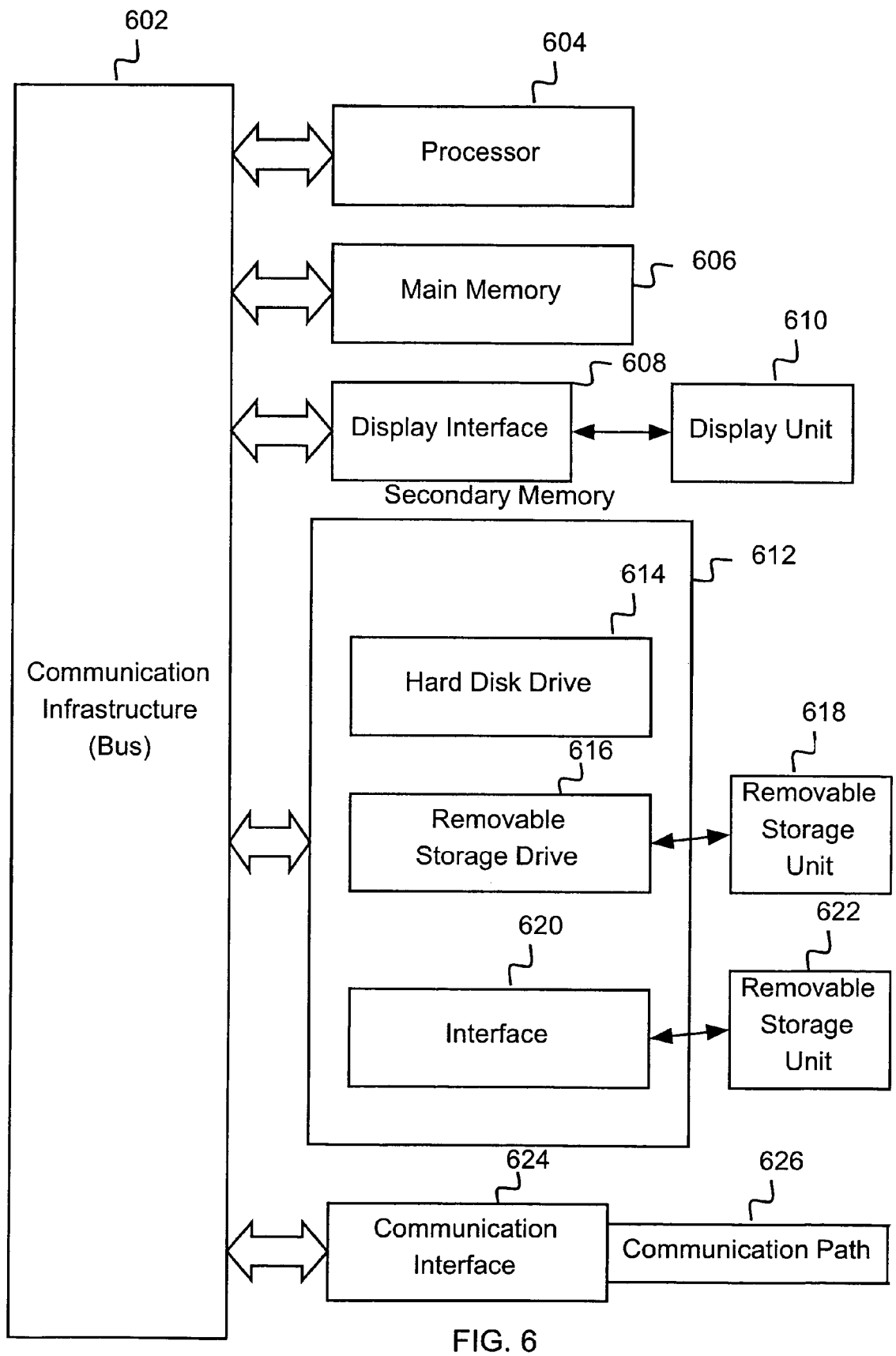
FIG. 6 is a high level block diagram showing an information processing system useful for implementing one embodiment of the present invention.

The present invention can be utilized for cooling any of a variety of electronic devices. In one embodiment of the present invention, the present invention is used to cool a microprocessor of an information processing system such as a computer. FIG. 6 is a high level block diagram showing an information processing system useful for implementing one embodiment of the present invention. The computer system includes one or more processors, such as processor 604. The processor 604 is connected to a communication infrastructure 602. Various software embodiments are described in terms of this exemplary computer system. After reading this description, it will become apparent to a person of ordinary skill in the relevant art(s) how to implement the invention using other computer systems and/or computer architectures.

The computer system can include a display interface 608 that forwards graphics, text, and other data from the communication infrastructure 602 for display on the display unit 610. The computer system also includes a main memory 606, preferably random access memory (RAM), and may also include a secondary memory 612. The secondary memory 612 may include, for example, a hard disk drive 614 and/or a removable storage drive 616, representing a floppy disk drive, a magnetic tape drive, an optical disk drive, etc. The removable storage drive 616 reads from and/or writes to a removable storage unit 618 in a manner well known to those having ordinary skill in the art. Removable storage unit 618, represents a floppy disk, a compact disc, magnetic tape, optical disk, etc. which is read by and written to by removable storage drive 616. As will be appreciated, the removable storage unit 618 includes a computer readable medium having stored therein computer software and/or data.

In alternative embodiments, the secondary memory 612 may include other similar means for allowing computer programs or other instructions to be loaded into the computer system. Such means may include, for example, a removable storage unit 622 and an interface 620. Examples of such may include a program cartridge and cartridge interface, a removable memory chip (such as an EPROM, or PROM) and associated socket, and other removable storage units 622 and interfaces 620 which allow software and data to be transferred from the removable storage unit 622 to the computer system.

The computer system may also include a communications interface 624. Communications interface 624 allows software and data to be transferred between the computer system and external devices. Examples of communications interface 624 may include a modem, a network interface (such as an Ethernet card), a communications port, a PCM-CIA slot and card, etc. Software and data transferred via communications interface 624 are in the form of signals which may be, for example, electronic, electromagnetic, optical, or other signals capable of being received by communications interface 624. These signals are provided to communications interface 624 via a communications path (i.e., channel) 626. This channel 626 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 606 and secondary memory 612, removable storage drive 616, a hard disk installed in hard disk drive 614, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network, that allow a computer to read such computer readable information.

Computer programs (also called computer control logic) are stored in main memory 606 and/or secondary memory 612. Computer programs may also be received via communications interface 624. In particular, the computer programs, when executed, enable the processor 604 to perform the features of the computer system. Accordingly, such computer programs represent controllers of the computer system.

What has been shown and discussed is a highly-simplified depiction of a programmable computer apparatus. Those skilled in the art will appreciate that other low-level components and connections are required in any practical application of a computer apparatus.

Therefore, while there has been described what is presently considered to be the preferred embodiment, it will be understood by those skilled in the art that other modifications can be made within the spirit of the invention.

What is claimed is:

1. A cooling structure for an electronic device comprising:
a single-piece thermal cap preloaded over the electronic device so that compliance of the cap maintains contact between the electronic device and the cap;
wherein the thermal cap comprises a horizontal top and only one compliant vertical support for providing compliance to the top in a z direction, the one compliant vertical support being perpendicular to the horizontal top and comprising a serpentine compliant part continuously disposed along an edge of the one compliant vertical support, and
wherein the thermal cap comprises a thermally conducting material and the thermal cap is attached to a circuit board for holding the electronic device and providing compliance in the vertical direction to conform to the thermal expansion by the device.

2. The system of claim 1, wherein the horizontal top further comprises a top plate comprising thinned edges that provide compliance required to accommodate movement in the z direction caused by thermal variations.

3. The system of claim 1, wherein the thermal cap comprises a first material having high thermal conductivity and a second material comprising compliant properties.

4. The system of claim 1 further comprising a coupling element disposed between the electronic device and the thermal cap.

5. The system of claim 1 further comprising pins inserted into holes in the thermal cap to provide the preloading.

6. The system of claim 1 wherein the electronic device is placed on a substrate and the cooling structure further comprises fasteners through the substrate.

7. The system of claim 1 further comprising a compliant thermal interface material applied between the electronic device and the thermal cap.

8. The system of claim 7 further comprising a spreader interface located over the electronic device and coupled with the thermal cap.

9. The system of claim 8 further comprising stops at corners of the spreader interface for containing the thermal interface material.

10. A method comprising steps of:

placing an electronic device on a substrate; and preloading a single-piece compliant thermal cap over the electronic device, so that compliance of the cap maintains contact between the device and the cap, wherein the preloading step comprises inserting pins into holes in the compliant thermal cap to provide the preloading;

wherein the thermal cap comprises compliant properties and heat conducting properties.

11. The method of claim 10 further comprising applying a thermal interface material between the electronic device and the thermal cap.

12. The method of claim 10 further comprising applying a spreader over the electronic device for coupling with the thermal cap.

13. The method of claim 10 further comprising including a coupling element between the electronic device and the thermal cap.

14. A preload method for attaching a compliant thermal cap to a semiconductor chip, the method comprising steps of:

affixing a serpentine compliant part along an edge of the thermal cap;

temporarily attaching attachment members to the thermal cap, via connecting members, in order to provide preload while the thermal cap is attached to the semiconductor chip; and removing the attachment members after the attachment is complete.

* * * * *